(12) United States Patent
French et al.

(10) Patent No.: US 8,816,199 B1
(45) Date of Patent: Aug. 26, 2014

(54) CABLE ROUTING SYSTEM

(75) Inventors: F. William French, Harvard, MA (US); Scot C. Tata, Blackstone, MA (US); Wei Jun Feng, Weymouth, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 13/436,914

(22) Filed: Mar. 31, 2012

(51) Int. Cl.
*H01R 13/46* (2006.01)
(52) U.S. Cl.
USPC .......................................................... 174/59
(58) Field of Classification Search
USPC ........... 211/26, 123, 175, 183, 189, 190, 191, 211/204, 206, 207; 248/51, 56, 65, 74.1, 248/200.1; 174/59, 60, 68.3
See application file for complete search history.

(56) References Cited

U.S. PATENT DOCUMENTS

| | | | | |
|---|---|---|---|---|
| 1,050,235 A * | 1/1913 | Scanlan | ........................ | 248/70 |
| 1,213,865 A * | 1/1917 | Gunn | ........................... | 248/343 |
| 1,793,035 A * | 2/1931 | Whitney | ....................... | 211/123 |
| 1,975,622 A * | 10/1934 | Schermerhorn | ......... | 297/452.55 |
| 2,103,106 A * | 12/1937 | Yurkovitch | .............. | 248/223.41 |
| 5,593,115 A * | 1/1997 | Lewis | ......................... | 248/68.1 |
| 5,788,087 A * | 8/1998 | Orlando | .......................... | 211/26 |
| 5,921,402 A * | 7/1999 | Magenheimer | ................. | 211/26 |
| 5,929,380 A * | 7/1999 | Carlson et al. | ............... | 174/68.3 |
| 5,934,631 A * | 8/1999 | Becker et al. | .............. | 248/200.1 |
| 6,271,476 B1 * | 8/2001 | Bobowick et al. | ............ | 174/135 |
| 6,375,129 B2 * | 4/2002 | Koziol | .......................... | 248/68.1 |
| 6,402,096 B1 * | 6/2002 | Ismert et al. | ................. | 248/68.1 |
| 6,445,865 B1 * | 9/2002 | Janus et al. | ................... | 385/135 |
| 6,613,981 B1 * | 9/2003 | Hathcock et al. | .............. | 174/69 |
| 7,168,576 B2 * | 1/2007 | Williams | ......................... | 211/26 |
| 7,364,244 B2 * | 4/2008 | Sandoval | ...................... | 312/333 |
| 7,473,846 B2 * | 1/2009 | Doerr et al. | ..................... | 174/69 |
| 7,601,922 B2 * | 10/2009 | Larsen et al. | ................ | 174/481 |
| 7,637,771 B2 * | 12/2009 | Laursen | ......................... | 439/501 |
| 7,654,398 B2 * | 2/2010 | Bridges et al. | .................. | 211/26 |
| 8,263,863 B2 * | 9/2012 | Young | .......................... | 174/68.1 |
| 2005/0067358 A1 * | 3/2005 | Lee et al. | ........................ | 211/26 |

* cited by examiner

*Primary Examiner* — Jonathan Liu
*Assistant Examiner* — James Twomey
(74) *Attorney, Agent, or Firm* — Brian J. Colandreo; Mark H. Whittenberger; Holland & Knight LLP

(57) ABSTRACT

A cable routing system includes a longitudinally-expanding body positionable within an IT rack having a frame and two or more NEMA rails coupled to the frame. A pair of mounting brackets are positioned proximate each distal end of the longitudinal-expanding body and configured to directly engage the frame of the IT rack. A cable routing tray is longitudinally affixed to the longitudinally-expanding body and configured to rout cables longitudinally along at least a portion of the longitudinally-expanding body. One or more vertical radiused supports are configured to define a minimum vertical bend radius for cables routed through the cable routing tray.

17 Claims, 4 Drawing Sheets

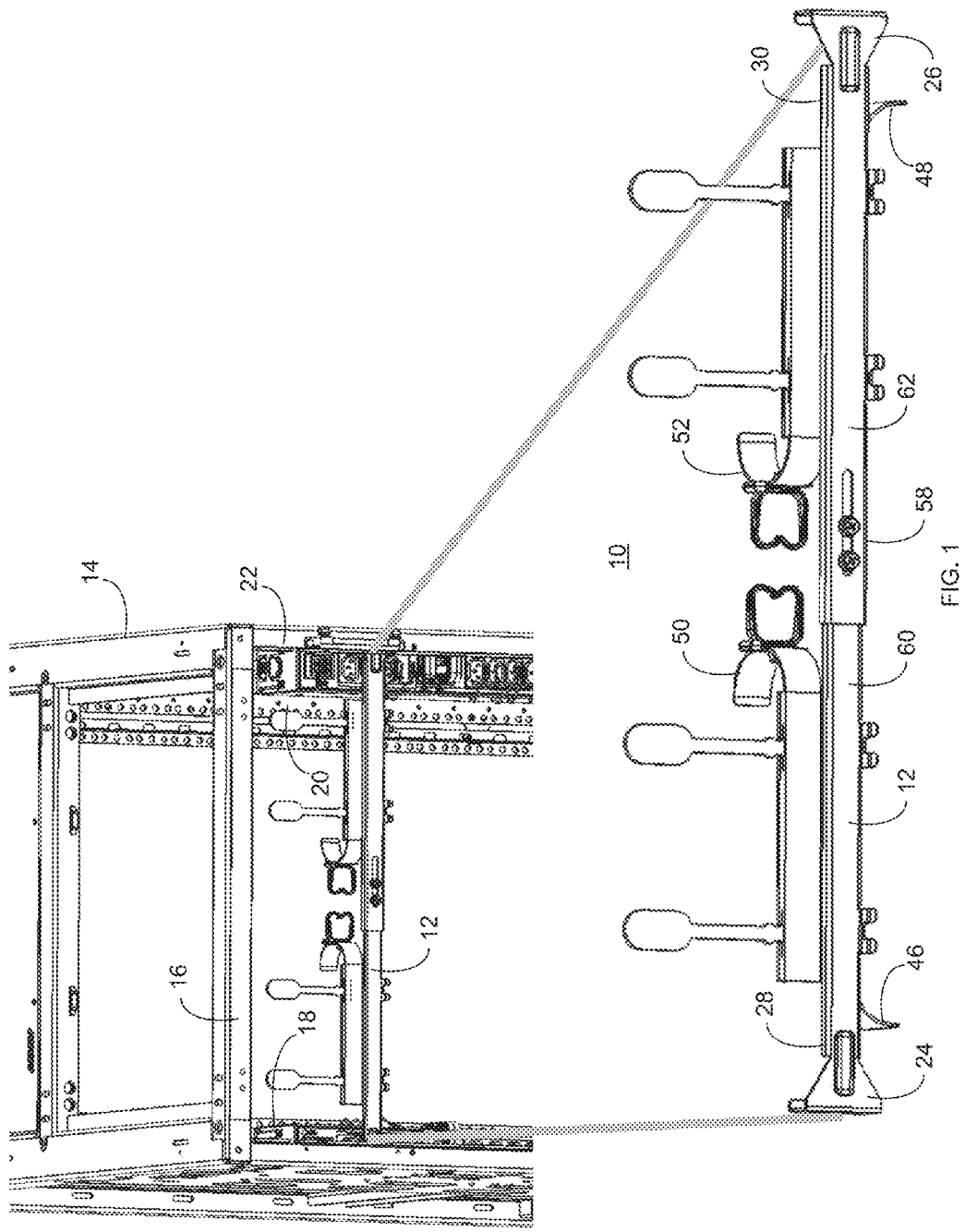

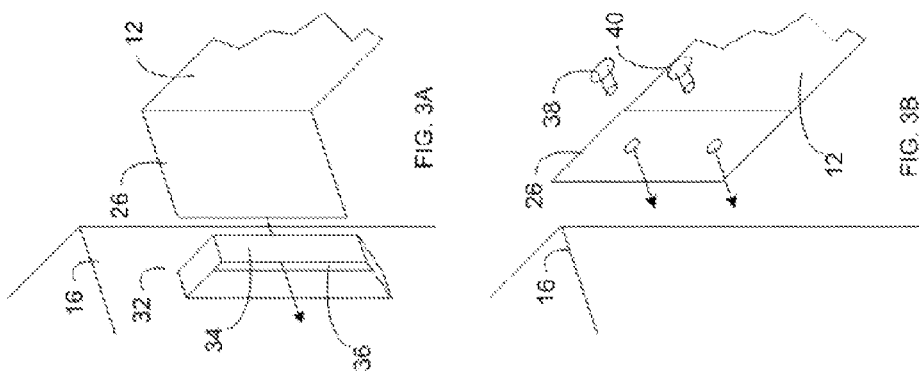
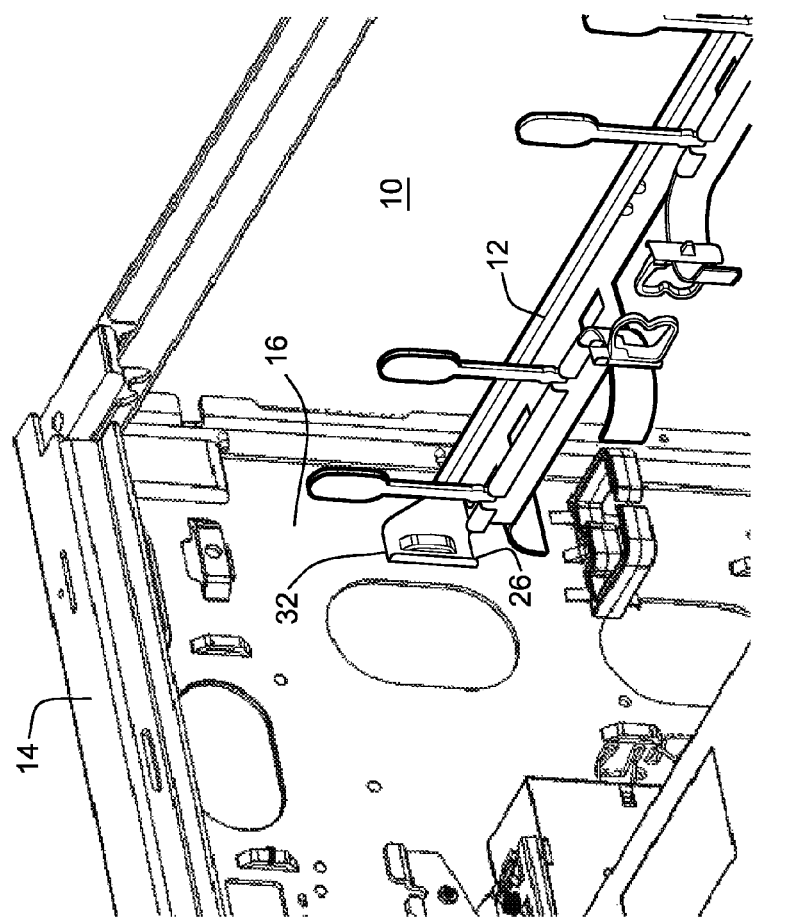

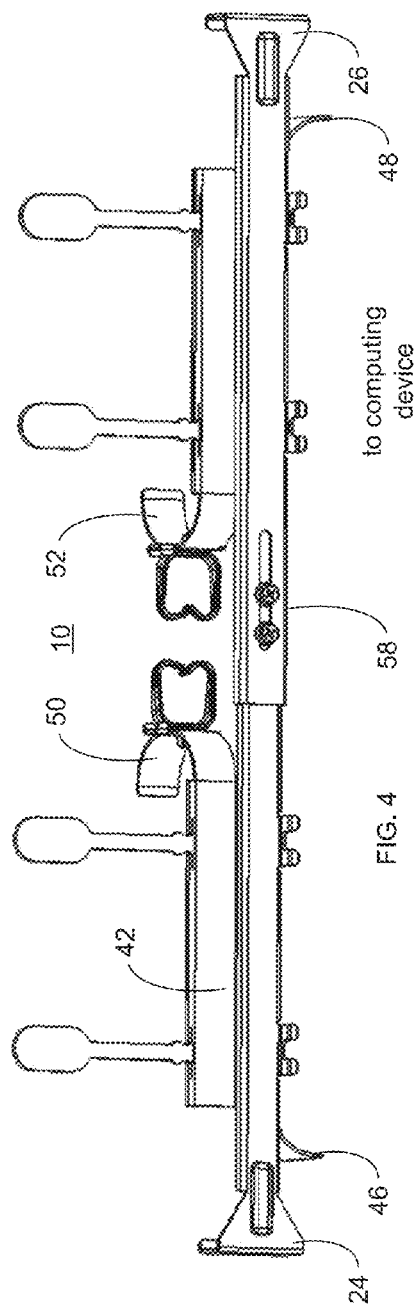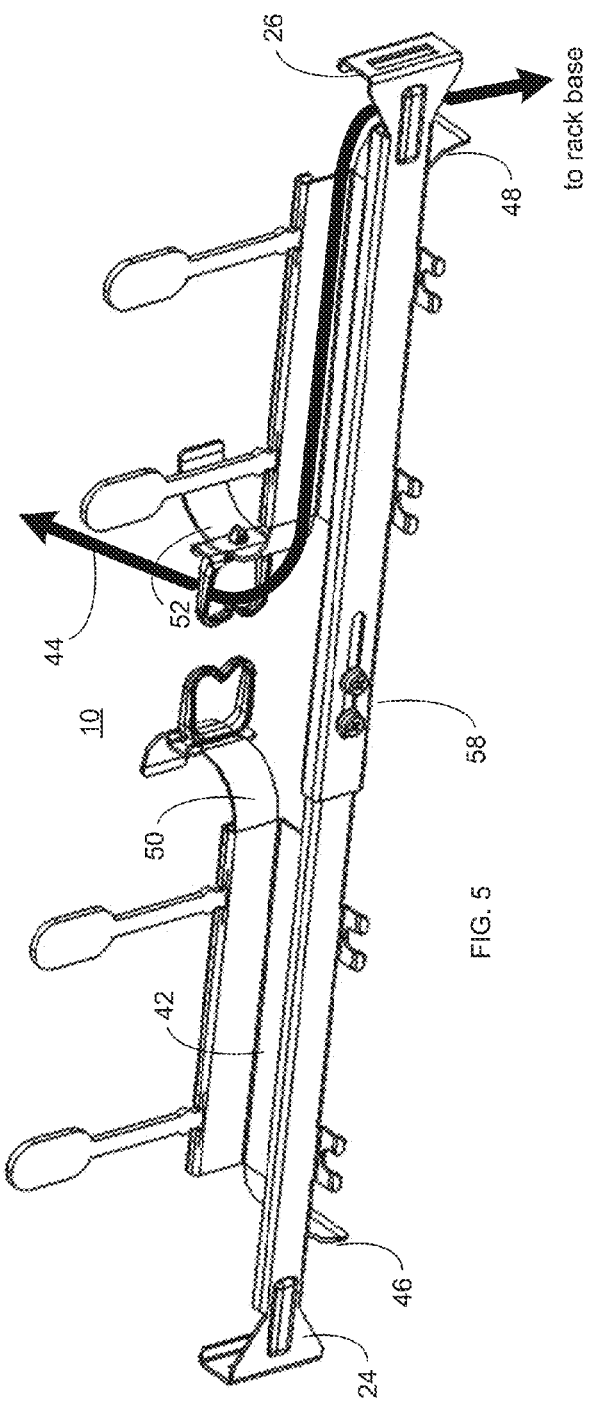

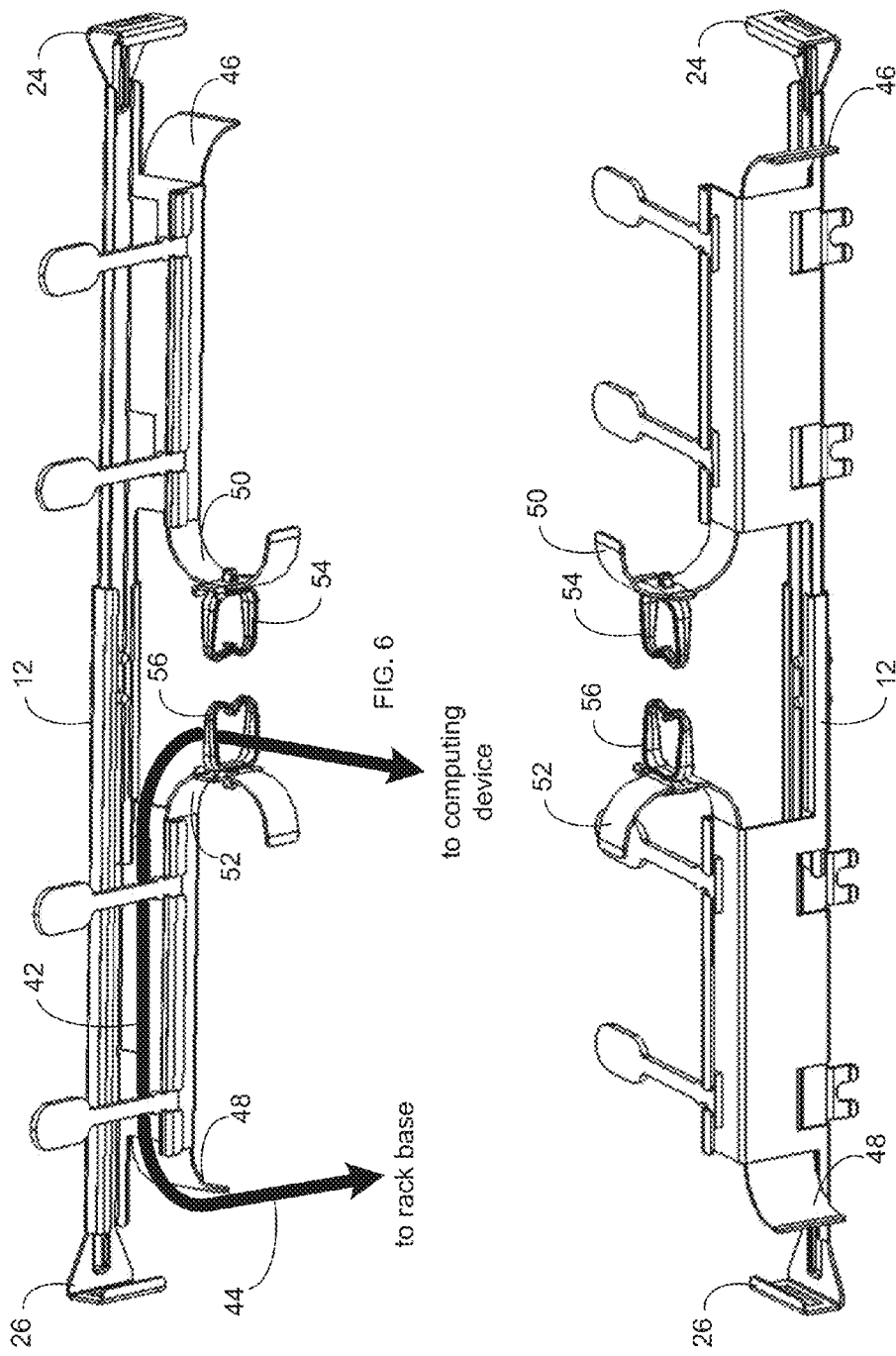

CABLE ROUTING SYSTEM

TECHNICAL FIELD

This disclosure relates to cable trays and, more particularly, to cable trays for use within an IT rack.

BACKGROUND

IT racks may be utilized to store and organize computing equipment. For example, IT racks may be placed within a server room and various computing devices (e.g. computers, switches, power supplies, storage arrays, routers) may be attached to NEMA rails included within the IT rack. Typically, the computing devices attached to these NEMA rails are defined based upon their size in rail units (U's), wherein a 1U device is half as high as a 2U device, which is half as high as a 4U device.

As these IT racks become more crowded, cable routing systems may be utilized to route the cables to the various devices included within these IT racks. Unfortunately, such cable routing systems are attached to the NEMA rails included within the IT rack and, therefore, take up a rack unit space that could otherwise be occupied by a computing device.

SUMMARY OF DISCLOSURE

In a first implementation, a cable routing system includes a longitudinally-expanding body positionable within an IT rack having a frame and two or more NEMA rails coupled to the frame. A pair of mounting brackets are positioned proximate each distal end of the longitudinal-expanding body and configured to directly engage the frame of the IT rack. A cable routing tray is longitudinally affixed to the longitudinally-expanding body and configured to rout cables longitudinally along at least a portion of the longitudinally-expanding body. One or more vertical radiused supports are configured to define a minimum vertical bend radius for cables routed through the cable routing tray.

One or more of the following features may be included. A locking assembly may lock the longitudinally-expanding body at a desired length. The locking assembly may include one or more screw assemblies.

The pair of mounting brackets may be configured to releasable engage a lance assembly included within the frame of the IT rack. The pair of mounting brackets may be configured to be releasably fastened, via one or more fastener assemblies, to the frame of the IT rack.

One or more horizontal radiused cable supports may be configured to define a minimum horizontal bend radius for cables routed through the cable routing tray. One or more loop assemblies may bundle cables proximate the horizontal radiused cable supports.

In another implementation, a cable routing system includes a longitudinally-expanding body positionable within an IT rack having a frame and two or more NEMA rails coupled to the frame. A pair of mounting brackets are positioned proximate each distal end of the longitudinal-expanding body and configured to directly engage the frame of the IT rack. A cable routing tray is longitudinally affixed to the longitudinally-expanding body and configured to rout cables longitudinally along at least a portion of the longitudinally-expanding body. One or more horizontal radiused cable supports are configured to define a minimum horizontal bend radius for cables routed through the cable routing tray. One or more of the following features may be included. A locking assembly may lock the longitudinally-expanding body at a desired length. The locking assembly may include one or more screw assemblies.

The pair of mounting brackets may be configured to releasable engage a lance assembly included within the frame of the IT rack. The pair of mounting brackets may be configured to be releasably fastened, via one or more fastener assemblies, to the frame of the IT rack.

One or more vertical radiused cable supports may be configured to define a minimum vertical bend radius for cables routed through the cable routing tray. One or more loop assemblies may bundle cables proximate the horizontal radiused cable supports.

In another implementation, a cable routing system includes a longitudinally-expanding body positionable within an IT rack having a frame and two or more NEMA rails coupled to the frame. A pair of mounting brackets are positioned proximate each distal end of the longitudinal-expanding body and configured to directly engage the frame of the IT rack. A cable routing tray is longitudinally affixed to the longitudinally-expanding body and configured to rout cables longitudinally along at least a portion of the longitudinally-expanding body. One or more horizontal radiused cable supports are configured to define a minimum horizontal bend radius for cables routed through the cable routing tray. One or more vertical radiused supports are configured to define a minimum vertical bend radius for cables routed through the cable routing tray.

One or more of the following features may be included. A locking assembly may lock the longitudinally-expanding body at a desired length. The locking assembly may include one or more screw assemblies.

The pair of mounting brackets may be configured to releasable engage a lance assembly included within the frame of the IT rack. The pair of mounting brackets may be configured to be releasably fastened, via one or more fastener assemblies, to the frame of the IT rack.

One or more loop assemblies may bundle cables proximate the horizontal radiused cable supports.

The details of one or more implementations are set forth in the accompanying drawings and the description below. Other features and advantages will become apparent from the description, the drawings, and the claims.

BRIEF DESCRIPTION OF THE DRAWINGS

FIG. 1 is a diagrammatic view of an IT rack including a cable routing system;

FIG. 2 is a diagrammatic view of a mounting bracket of the cable routing system of FIG. 1 engaging an IT rack;

FIGS. 3A-3B are detail views of various types of mounting brackets of the cable routing system of FIG. 1; and FIGS. 4-7 are various diagrammatic views of the cable routing system of FIG. 1.

Like reference symbols in the various drawings indicate like elements.

DETAILED DESCRIPTION OF THE PREFERRED EMBODIMENTS

Referring to FIG. 1, there is shown cable routing system 10 that may include longitudinally-expanding body 12 positionable within IT rack 14 having frame 16 and two or more NEMA rails 18, 20 coupled to frame 16. As is known in the art, IT rack 14 is a standardized rack (usually 19 inches wide) configured to house computing equipment. Typically, computing equipment that would fit within IT rack 14 is generally described as rack mountable computing equipment.

As discussed above, IT rack 14 includes frame 16 (which may include one or more vertical supports, horizontal supports, and cross braces) and several NEMA rails (e.g., rails 18, 20) mounted to frame 16. Rails 18, 20 may include a plurality of evenly spaced holes that may be used for mounting the various pieces of computing equipment. Accordingly, in IT rack 14, one or more NEMA rails (e.g., rails 18, 20) may be attached to frame 16 (on opposite sides of IT rack 14) to allow for the mounting of the above-described computing equipment. By standardizing the spacing between rails 18, 20, computing equipment that fits within one IT rack will also fit within other IT racks.

Typically, IT racks are defined in accordance with the number of rack units (U's) included within the rack. As discussed above, a 1U computing device is half as high as a 2U computing device, which is half as high as a 3U computing device. Accordingly, while the number of rack units available within a particular IT rack is defined by the size of the IT rack, the number of computing devices mountable within the IT rack will vary depending upon the size (in rack units) of the computing devices mounted within the particular IT rack. Accordingly, by reducing the number of rack units that a particular computing device utilizes within an IT rack, additional computing devices may be mounted within the IT rack.

Cable mounting system 10 is configured so that it is not mounted to the above-described NEMA rails (rails 18, 20). Specifically, cable mounting system 10 is configured to be positioned towards the rear 22 of IT rack 14 and to directly engage frame 16 of IT rack 14 (as opposed to rails 18, 20). Accordingly, cable mounting system 10 is configured so that it does not occupy a computing device "slot" within IT rack 14. Therefore, the use of cable mounting system 10 does not reduce the maximum number of computing devices mountable within IT rack 14.

Cable mounting system 10 may include a pair of mounting brackets (mounting brackets 24, 26) that are positioned proximate each distal end (distal ends 28, 30) of longitudinal-expanding body 12 and are configured to directly engage frame 16 of IT rack 14.

Referring also to FIGS. 2, 3A & 3B, mounting brackets 24, 26 may be configured in various ways depending upon the manner in which mounting brackets 24, 26 are to be attached to frame 16 of IT rack 14. For example, mountain brackets 24, 26 may be configured to releasable engage a lance assembly (e.g., lance assembly 32) included within frame 16 of IT rack 14. In this particular example, lance assembly 32 may be configured to include loop 34 attached to frame 16 that forms slot 36 through which mounting bracket 26 may slide. Alternatively, mounting brackets 24, 26 may be configured to be releasably fastened, via one or more fastener assemblies (screws 38, 40) to frame 16 of IT rack 14.

Referring also to FIGS. 4-7, cable mounting system 10 may include cable routing tray 42 that is longitudinally affixed to longitudinally-expanding body 12 and configured to rout cables (e.g. cable 44) along at least a portion of longitudinally-expanding body 12. For example, cable routing tray 42 may be formed into the upper surface of longitudinally-expanding body 12. Examples of cable 44 may include but are not limited to copper and/or fiber-based data cables.

Cable mounting system 10 may include one or more vertical radiused supports (e.g., vertical radiused supports 46, 48) that may be configured to define a minimum vertical bend radius for cables (e.g., cable 44) routed through cable routing tray 42. Additionally, one or more horizontal radiused cable supports (e.g., horizontal radiused supports 50, 52) may be configured to define a minimum horizontal bend radius for cables (e.g., cable 44) routed through cable routing tray 42. Further, cable mounting system 10 may include one or more loop assemblies (e.g., loop assemblies 54, 56) that may be configured to bundle cables proximate horizontal radiused cable supports 50, 52.

For example, cable 44 may enter at the bottom of IT rack 14 and travel upward toward cable mounting system 10. Cable 44 may enter cable mounting system 10 and contact vertical radiused support 46 which may define a minimum bend radius for cable 44 that is no smaller than a predefined size. Maintaining such a minimum defined bend radius is important for cables that may be damaged if they are bent to too small a radius (e.g. fiber-optic cable). Upon exiting vertical radiused support 46, cable 44 may lay within cable routing tray 42 until contacting horizontal radiused support 50 which (similar to vertical radiused support 46) may define a minimum bend radius for cable 44 that is no smaller than a predefined size. Cable 44 may then pass through the loop assembly 54 and may subsequently be coupled to one of the computing devices mounted within IT rack 14.

Longitudinally-expanding body 12 may include locking assembly 58 that may be configured to lock longitudinally-expanding body 12 at a desired length. For example, locking assembly 58 may include one or more screw assemblies that are configured to rigidly affix first half 60 of longitudinally-expanding body 12 to second half 62 of longitudinally-expanding body 12.

Having thus described the disclosure of the present application in detail and by reference to embodiments thereof, it will be apparent that modifications and variations are possible without departing from the scope of the disclosure defined in the appended claims.

What is claimed is:

1. A cable routing system comprising:
   a longitudinally-expanding body positionable within an IT rack having a frame and two or more rails coupled to the frame;
   a pair of mounting brackets positioned proximate each distal end of the longitudinal-expanding body and configured to directly engage the frame of the IT rack;
   a first cable routing tray and a second cable routing tray longitudinally affixed to the longitudinally-expanding body and configured to route cables longitudinally along at least a portion of the longitudinally-expanding body, wherein each cable routing tray includes a flat surface and at least one expanding panel along an edge of the flat surface parallel to the longitudinally-expanding body and perpendicular to the flat surface creating a U-shaped channel configured to support the cables on the flat surface of the respective cable routing tray;
   one or more vertical radiused supports including at least one vertically arced surface configured to define a minimum vertical bend radius for cables routed vertically and horizontally through the respective cable routing tray; and
   one or more loop assemblies for bundling cables, wherein the one or more loop assemblies are coupled to one or more horizontal radiused cable supports;
   wherein the longitudinally-expanding body includes a first portion affixed to the first cable routing tray and a second portion affixed to the second cable routing tray, wherein the first portion and the second portion of the longitudinally-expanding body are coupled at a locking assembly.

2. The cable routing system of claim 1 wherein the locking assembly locks the longitudinally-expanding body at a desired length.

3. The cable routing system of claim 2 wherein the locking assembly includes one or more screw assemblies.

4. The cable routing system of claim 1 wherein the pair of mounting brackets are configured to releasably engage a lance assembly included within the frame of the IT rack, wherein the lance assembly includes a loop attached to the frame of the IT rack for the pair of mounting brackets to releasably engage.

5. The cable routing system of claim 1 wherein the pair of mounting brackets are configured to be releasably fastened, via one or more fastener assemblies, to the frame of the IT rack.

6. The cable routing system of claim 1 wherein the one or more horizontal radiused cable supports include at least one horizontally arced surface configured to define a minimum horizontal bend radius for cables routed through the cable routing tray.

7. A cable routing system comprising:
   a longitudinally-expanding body positionable within an IT rack having a frame and two or more rails coupled to the frame;
   a pair of mounting brackets positioned proximate each distal end of the longitudinal-expanding body and configured to directly engage the frame of the IT rack;
   a first cable routing tray and a second cable routing tray longitudinally affixed to the longitudinally-expanding body and configured to route cables longitudinally along at least a portion of the longitudinally-expanding body, wherein each cable routing tray includes a flat surface and at least one expanding along an edge of the flat surface parallel to the longitudinally-expanding body and perpendicular to the flat surface creating a U-shaped channel configured to support the cables on the flat surface of the respective cable routing tray;
   one or more horizontal radiused cable supports including at least one horizontally arced surface configured to define a minimum horizontal bend radius for cables routed vertically and horizontally through the respective cable routing tray; and
   one or more loop assemblies for bundling cables, wherein the one or more loop assemblies are coupled to the at least one horizontally arced surface;
   wherein the longitudinally-expanding body includes a first portion affixed to the first cable routing tray and a second portion affixed to the second cable routing tray, wherein the first portion and the second portion of the longitudinally-expanding body are coupled at a locking assembly.

8. The cable routing system of claim 7 wherein the locking assembly locks the longitudinally-expanding body at a desired length.

9. The cable routing system of claim 8 wherein the locking assembly includes one or more screw assemblies.

10. The cable routing system of claim 7 wherein the pair of mounting brackets are configured to releasably engage a lance assembly included within the frame of the IT rack, wherein the lance assembly includes a loop attached to the frame of the IT rack for the pair of mounting brackets to releasably engage.

11. The cable routing system of claim 7 wherein the pair of mounting brackets are configured to be releasably fastened, via one or more fastener assemblies, to the frame of the IT rack.

12. The cable routing system of claim 7 further comprising: one or more vertical radiused supports including at least one vertically arced surface configured to define a minimum vertical bend radius for cables routed through the cable routing tray.

13. A cable routing system comprising:
   a longitudinally-expanding body positionable within an IT rack having a frame and two or more rails coupled to the frame;
   a pair of mounting brackets positioned proximate each distal end of the longitudinal-expanding body and configured to directly engage the frame of the IT rack;
   a first cable routing tray and a second cable routing tray longitudinally affixed to the longitudinally-expanding body and configured to rout cables longitudinally along at least a portion of the longitudinally-expanding body, wherein each cable routing tray includes at least one flat surface and a panel expanding along an edge of the flat surface parallel to the longitudinally-expanding body and perpendicular to the flat surface creating a U-shaped channel configured to support the cables on the flat surface of the respective cable routing tray;
   one or more horizontal radiused cable supports including at least one horizontally arced surface configured to define a minimum horizontal bend radius for cables routed through the respective cable routing tray;
   one or more vertical radiused supports including at least one vertically arced surface configured to define a minimum vertical bend radius for cables routed vertically and horizontally through the respective cable routing tray; and
   one or more loop assemblies for bundling cables, wherein the one or more loop assemblies are coupled to the at least one horizontally arced surface;
   wherein the longitudinally-expanding body includes a first portion affixed to the first cable routing tray and a second portion affixed to the second cable routing tray, wherein the first portion and the second portion of the longitudinally-expanding body are coupled at a locking assembly.

14. The cable routing system of claim 13 wherein the locking assembly locks the longitudinally-expanding body at a desired length.

15. The cable routing system of claim 14 wherein the locking assembly includes one or more screw assemblies.

16. The cable routing system of claim 13 wherein the pair of mounting brackets are configured to releasably engage a lance assembly included within the frame of the IT rack, wherein the lance assembly includes a loop attached to the frame of the IT rack for the pair of mounting brackets to releasably engage.

17. The cable routing system of claim 13 wherein the pair of mounting brackets are configured to be releasably fastened, via one or more fastener assemblies, to the frame of the IT rack.

* * * * *